United States Patent
Hasegawa et al.

(10) Patent No.: US 7,463,457 B2
(45) Date of Patent: Dec. 9, 2008

(54) CPP GIANT MAGNETORESISTIVE ELEMENT WITH PARTICULAR BULK SCATTERING COEFFICIENT

(75) Inventors: Naoya Hasegawa, Niigata-ken (JP); Masamichi Saito, Niigata-ken (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/745,979

(22) Filed: May 8, 2007

(65) Prior Publication Data
US 2007/0206336 A1 Sep. 6, 2007

Related U.S. Application Data

(62) Division of application No. 10/842,923, filed on May 10, 2004, now Pat. No. 7,295,409.

(30) Foreign Application Priority Data

May 12, 2003 (JP) .............................. 2003-132934

(51) Int. Cl.
*G11B 5/39* (2006.01)
(52) U.S. Cl. .................................. 360/324.11
(58) Field of Classification Search ............ 360/324.11, 360/324.12
See application file for complete search history.

(56) References Cited

U.S. PATENT DOCUMENTS

| | | | | |
|---|---|---|---|---|
| 6,159,593 | A * | 12/2000 | Iwasaki et al. ........... | 428/811.2 |
| 6,563,679 | B1 | 5/2003 | Li et al. | |
| 6,563,681 | B1 | 5/2003 | Sasaki et al. | |
| 6,650,512 | B1 * | 11/2003 | Gill ....................... | 360/324.12 |
| 6,710,987 | B2 | 3/2004 | Sun et al. | |
| 6,798,626 | B2 * | 9/2004 | Hayashi et al. .......... | 360/324.2 |
| 6,882,510 | B2 * | 4/2005 | Parker et al. ........... | 360/324.11 |
| 6,953,601 | B2 * | 10/2005 | Li et al. ................. | 427/131 |
| 6,954,342 | B2 * | 10/2005 | Kula et al. ............. | 360/324.11 |
| 7,229,706 | B2 * | 6/2007 | Hasegawa et al. ........ | 428/811.5 |
| 2001/0003023 | A1 | 6/2001 | Saito et al. | |
| 2002/0159201 | A1 | 10/2002 | Li et al. | |
| 2003/0030946 | A1 | 2/2003 | Hasegawa | |
| 2003/0072111 | A1 | 4/2003 | Hasegawa et al. | |
| 2003/0203238 | A1 | 10/2003 | Saito et al. | |
| 2004/0141260 | A1 * | 7/2004 | Hasegawa et al. ...... | 360/324.11 |

FOREIGN PATENT DOCUMENTS

GB     2 387 957     10/2003

(Continued)

*Primary Examiner*—Brian E Miller
(74) *Attorney, Agent, or Firm*—Brinks Hofer Gilson & Lione

(57) ABSTRACT

A CPP giant magnetoresistive element includes a multilayer film including a lower pinned magnetic layer having a laminated ferrimagnetic structure including a lower first pinned magnetic sublayer, a lower nonmagnetic intermediate sublayer, and a lower second pinned magnetic sublayer; a lower nonmagnetic layer; a free magnetic layer; an upper nonmagnetic layer; and an upper pinned magnetic layer having a laminated ferrimagnetic structure including an upper second pinned magnetic sublayer, an upper nonmagnetic intermediate sublayer, and an upper first pinned magnetic sublayer disposed in that order. Each of the free magnetic layer and the lower and upper second pinned magnetic sublayers is composed of a NiFeX alloy or NiFeCoX alloy, X being an element which decreases the saturation magnetization of a NiFe or NiFeCo base.

11 Claims, 2 Drawing Sheets

FOREIGN PATENT DOCUMENTS

| | | |
|---|---|---|
| JP | 2000-340858 | 12/2000 |
| JP | 2002-175611 | 6/2002 |
| JP | 2002-232040 | 8/2002 |
| JP | 2002-261351 | 9/2002 |
| JP | 2002-288946 | 10/2002 |
| JP | 2002-289945 | 10/2002 |

* cited by examiner

CPP GIANT MAGNETORESISTIVE ELEMENT WITH PARTICULAR BULK SCATTERING COEFFICIENT

This patent document is a divisional application and claims the benefit pursuant to 35 U.S.C. § 121 of U.S. application Ser. No. 10/842,923 filed on May 10, 2004 now U.S. Pat No. 7,295,409, and is hereby incorporated by reference. This patent document also claims the benefit of Japanese Patent Application No. JP2003-132934 filed May 12, 2003, which is also hereby incorporated by reference.

BACKGROUND OF THE INVENTION

1. Field of the Invention

The present invention relates to current-perpendicular-to-the-plane (CPP) giant magnetoresistive elements in which a sensing current flows in the thickness direction (perpendicular to the planes) of the individual layers constituting the elements.

2. Description of the Related Art

Giant magnetoresistive (GMR) elements used for hard disk drives, magnetic sensors, etc., can be classified into two groups, i.e., current-in-the-plane (CIP) elements in which a sensing current flows parallel to the planes of the individual layers constituting the elements, and current-perpendicular-to-the-plane (CPP) elements in which a sensing current flows perpendicular to the planes of the individual layers constituting the elements.

CIP-GMR elements are commonly used products. However, in the CIP-GMR element, as the track width is narrowed, the output (the rate of change in resistance $\Delta R/R$) is decreased. Therefore, if an attempt is made to further narrow the track width, various problems will occur. In contrast, in the CPP-GMR element, the output (the change in resistance per unit area $\Delta R \cdot A$) varies depending on the thickness of the element. At a constant current density, even if the track width is narrowed, the output does not change.

CPP-GMR elements in which the element output does not depend on the track width are thought to be more suitable for track narrowing compared to CIP-GMR elements and have been receiving attention recently. Conventional CPP-GMR elements are disclosed in Japanese Unexamined Patent Application Publication No. 2002-175611, etc.

For example, a so-called dual spin-valve CPP-GMR element typically includes a multilayer film in which a lower antiferromagnetic layer, a lower pinned magnetic layer, a lower nonmagnetic layer, a free magnetic layer, an upper nonmagnetic layer, an upper pinned magnetic layer, and an upper antiferromagnetic layer are disposed in that order from the bottom; first and second electrode layers disposed on the top and bottom of the multilayer film; hard bias layers disposed on both sides of the free magnetic layer; and insulating layers disposed above and below the hard bias layers. Each of the lower pinned magnetic layer and the upper pinned magnetic layer often has a laminated ferrimagnetic structure which includes a first pinned magnetic sublayer in contact with the lower antiferromagnetic layer or the upper antiferromagnetic layer, a nonmagnetic intermediate sublayer disposed on the first pinned magnetic sublayer, and a second pinned magnetic sublayer disposed on the first pinned magnetic sublayer with the nonmagnetic intermediate sublayer therebetween. Each of the upper antiferromagnetic layer and the lower antiferromagnetic layer is, for example, composed of PtMn; each of the upper nonmagnetic layer and the lower nonmagnetic layer is, for example, composed of Cu; and each of the upper nonmagnetic intermediate sublayer and the lower nonmagnetic intermediate sublayer is, for example, composed of Ru. Each of the upper first pinned magnetic sublayer, the lower first pinned magnetic sublayer, the upper second pinned magnetic sublayer, the lower second pinned magnetic sublayer, and the free magnetic layer is, for example, composed of CoFe or NiFe.

In the conventional CPP-GMR element having the structure described above, under the present situation, it is not possible to achieve an element output that is sufficient for practical use. The element output is proportional to the intensity of the current flowing through the element and the change in resistance per unit area $\Delta R \cdot A$. In order to increase the element output, the sensing current must be increased or the change in resistance per unit area $\Delta R \cdot A$ must be increased. However, if the sensing current is increased, the CPP-GMR element generates heat, resulting in a decrease in the output. Therefore, it is not possible to increase the sensing current above a certain value. Accordingly, how the change in resistance per unit area $\Delta R \cdot A$ is improved is a subject to be studied.

Recently, on the assumption that if the thickness of a CPP-GMR element (in particular, the thicknesses of the layers contributing to the magnetoresistance effect) is increased, the change in resistance per unit area $\Delta R \cdot A$ will be increased, the free magnetic layer and the second pinned magnetic sublayer (the lower second pinned magnetic sublayer and the upper second pinned magnetic sublayer in the dual type) are formed such that they have large thicknesses. Specifically, each of the free magnetic layer and the second pinned magnetic sublayer is formed so as to have a three-layered structure, for example, composed of CoFe/NiFe/CoFe, in which the thickness of the NiFe portion is set at about 40 to 100 Å, the NiFe portion having a larger spin-dependent bulk scattering coefficient $\beta$ than that of the CoFe portion.

However, if the thicknesses of the free magnetic layer and the second pinned magnetic sublayer are increased, it becomes difficult to place the CPP-GMR element between the upper shielding layer and the lower shielding layer of a magnetic head. Since the distance between the upper shielding layer and the lower shielding layer defines the track recording density, it is not possible to greatly change the distance.

If the thickness of the free magnetic layer is increased, the magnetic thickness (magnetic moment per unit area; saturation magnetization Ms×thickness t) is also increased. Consequently, the magnetization of the free magnetic layer is not easily rotated in response to a very small magnetic field from outside (a recording medium), resulting in a decrease in output sensitivity.

On the other hand, in the pinned magnetic layer (the upper pinned magnetic layer and the lower pinned magnetic layer in the dual type), if the thickness of the second pinned magnetic sublayer is increased, the magnetic thickness of the second pinned magnetic sublayer is increased, and the exchange coupling magnetic field which maintains the RKKY antiparallel state of the first pinned magnetic sublayer and the second pinned magnetic sublayer being interposed by the nonmagnetic intermediate sublayer is decreased. If the exchange coupling magnetic field is decreased, the magnetization of the second pinned magnetic sublayer is greatly inclined due to the longitudinal bias magnetic field of the hard bias layer, resulting in an increase in output asymmetry. There is also a possibility that the magnetization of the second pinned magnetic sublayer is reversed due to electrostatic discharge (ESD), resulting in a degradation in reliability.

As described above, if the thicknesses of the free magnetic layer and the pinned magnetic layer (in particular, the second pinned magnetic sublayer) are increased, although the change in resistance per unit area ΔR·A is increased, various disadvantageous effects are caused.

SUMMARY OF THE INVENTION

It is an object of the present invention to provide a CPP giant magnetoresistive element in which the change in resistance per unit area ΔR·A can be increased without degrading output sensitivity and reliability and without increasing asymmetry.

The present invention has been achieved by focusing on the fact that if the saturation magnetization of the free magnetic layer and/or the pinned magnetic layer is small, even if the thicknesses of the free magnetic layer and the pinned magnetic layer are increased, an increase in the magnetic thickness can be properly suppressed.

In a first aspect of the present invention, a CPP giant magnetoresistive element includes a multilayer film including a pinned magnetic layer, a nonmagnetic layer, and a free magnetic layer disposed in that order, a current flowing in the thickness direction of the multilayer film, wherein the free magnetic layer is composed of a NiFeX alloy or NiFeCoX alloy, wherein X decreases the saturation magnetization of a NiFe or NiFeCo base.

The NiFeX alloy or NiFeCoX alloy has a lower saturation magnetization than that of the NiFe or NiFeCo base due to the incorporation of X. By using the NiFeX alloy or NiFeCoX alloy, even if the thickness of the free magnetic layer is increased, it is possible to properly suppress an increase in the magnetic thickness (the magnetic moment per unit area Ms·t) of the free magnetic layer, and thereby the rotation of the magnetization of the free magnetic layer is not obstructed. Consequently, if the thickness of the free magnetic layer is increased, it is possible to increase the change in resistance per unit area ΔR·A without degrading the output sensitivity.

The change in resistance per unit area ΔR·A also varies depending on the combination of positive and negative signs of the spin-dependent bulk scattering coefficients β of the individual layers (the pinned magnetic layer, the nonmagnetic layer, and the free magnetic layer) which contribute to the giant magnetoresistance effect.

The spin-dependent bulk scattering coefficient β is a value inherent in a magnetic material, the coefficient satisfying the relationship $\rho\downarrow/\rho\uparrow=(1+\beta)/(1-\beta)$, wherein $-1 \leq \beta \leq 1$. $\rho\downarrow$ is the resistivity to minority conduction electrons among the conduction electrons flowing through the magnetic material, and $\rho\uparrow$ is the resistivity to majority conduction electrons among the conduction electrons flowing through the magnetic material.

The element X incorporated into the NiFe or NiFeCo base is preferably selected so as not to reduce the difference in the mobility between spin-up conduction electrons and spin-down conduction electrons, i.e., so as not to decrease the change in resistance per unit area ΔR·A.

For example, when the nonmagnetic layer is composed of Cu, preferably, the spin-dependent bulk scattering coefficient β of the NiFeX alloy or NiFeCoX alloy constituting the free magnetic layer and the spin-dependent bulk scattering coefficient β of the NiFe or NiFeCo base have the same positive or negative sign. That is, preferably, the element X maintains the positive or negative sign of the spin-dependent bulk scattering coefficient β of the NiFe or NiFeCo base.

Alternatively, when the nonmagnetic layer is composed of Cr or Ru, preferably, the positive or negative sign of the spin-dependent bulk scattering coefficient β of the NiFeX alloy or NiFeCoX alloy constituting the free magnetic layer is opposite that of the spin-dependent bulk scattering coefficient β of NiFe or NiFeCo. That is, preferably, the element X reverses the sign of the spin-dependent bulk scattering coefficient β of the NiFe or NiFeCo base.

If the spin-dependent bulk scattering coefficient β of the NiFeX alloy or NiFeCoX alloy is defined as described above, even if the material for the free magnetic layer is changed from NiFe or NiFeCo to the NiFeX alloy or NiFeCoX alloy, it is possible to maintain the change in resistance per unit area ΔR·A satisfactorily.

Preferably, the NiFeX alloy or NiFeCoX alloy constituting the free magnetic layer has a higher resistivity than that of the NiFe or NiFeCo base. In other words, preferably, the element X increases the resistivity of the NiFeX alloy or NiFeCoX alloy from that of the NiFe or NiFeCo base.

If the resistivity of the NiFeX alloy or NiFeCoX alloy is higher than that of the NiFe or NiFeCo base, the spin diffusion length of the NiFeX alloy or NiFeCoX alloy becomes shorter than that of the NiFe or NiFeCo base. Among magnetic materials having substantially the same spin-dependent bulk scattering coefficient β, the magnetic material having a shorter spin diffusion length makes it possible to further improve the change in resistance per unit area ΔR·A at a small thickness. Therefore, if the material for the free magnetic layer is changed from NiFe or NiFeCo to the NiFeX alloy or NiFeCoX alloy, even if the thickness of the free magnetic layer is decreased, a decrease in the change in resistance per unit area ΔR·A can be suppressed satisfactorily. If the thickness of the free magnetic layer is decreased, the magnetic thickness of the free magnetic layer is decreased, and therefore the magnetization of the free magnetic layer can be more easily rotated, resulting in a further improvement in the output sensitivity.

Preferably, X is an element selected from the group consisting of Cu, Au, Ag, Zn, Mn, Al, Cd, Zr, and Hf. These elements satisfy all of the following conditions:
  (1) the saturation magnetization of the NiFe or NiFeCo base is decreased;
  (2) when the nonmagnetic layer is composed of Cu, the positive or negative sign of the spin-dependent bulk scattering coefficient β of the NiFe or NiFeCo base is maintained; and
  (3) the resistivity of the NiFeX alloy or NiFeCoX alloy is increased from that of the NiFe or NiFeCo base.

The X content in the NiFeX alloy or NiFeCoX alloy is preferably 3 to 40 atomic percent. If the X content is less than 3 atomic percent, the saturation magnetization of the NiFe or NiFeCo base is not easily decreased. If the X content exceeds 40 atomic percent, the saturation magnetization of the NiFe or NiFeCo base is excessively decreased, resulting in thermal instability.

In the NiFe or NiFeCo base into which X is incorporated, preferably, the atomic ratio Ni:Fe is 9:1 to 7:3, and the Co content is 0 to 40 atomic percent. Within the ranges described above, since soft magnetic properties can be maintained satisfactorily, the rotation of the magnetization of the free magnetic layer is not affected.

From a practical point of view, preferably, the free magnetic layer has a three-layered structure, for example, including an intermediate sublayer composed of the NiFeX alloy or NiFeCoX alloy, a first CoFe sublayer under the intermediate sublayer, and a second CoFe sublayer on the intermediate sublayer, the first CoFe sublayer and the second CoFe sublayer being thinner than the intermediate sublayer, so that Ni in the NiFeX alloy or NiFeCoX alloy does not diffuse into the nonmagnetic layer (Cu). However, if the CPP giant magnetoresistive element has a single spin-valve structure including only one nonmagnetic layer, from a practical point of view, preferably, the free magnetic layer has a two-layered structure in which a CoFe sublayer is disposed in contact with the nonmagnetic layer.

The free magnetic layer may have a laminated ferrimagnetic structure including a first free magnetic sublayer disposed on the nonmagnetic layer and a second free magnetic sublayer disposed on the first free magnetic sublayer with a nonmagnetic intermediate sublayer therebetween. When the free magnetic layer has the laminated ferrimagnetic structure, preferably, each of the first free magnetic sublayer and the second free magnetic sublayer is composed of the NiFeX alloy or NiFeCoX alloy.

In a second aspect of the present invention, a CPP giant magnetoresistive element includes a multilayer film including a pinned magnetic layer, a nonmagnetic layer, and a free magnetic layer disposed in that order, a current flowing in the thickness direction of the multilayer film, wherein the pinned magnetic layer includes a first pinned magnetic sublayer and a second pinned magnetic sublayer disposed on the first pinned magnetic sublayer with a nonmagnetic intermediate sublayer therebetween, and at least the second pinned magnetic sublayer is composed of a NiFeX alloy or NiFeCoX alloy, wherein X decreases the saturation magnetization of a NiFe or NiFeCo base.

The NiFeX alloy or NiFeCoX alloy has a lower saturation magnetization than that of the NiFe or NiFeCo base due to the incorporation of X. By using the NiFeX alloy or NiFeCoX alloy, even if the thickness of the second pinned magnetic sublayer is increased, it is possible to properly control the magnetic thickness (the magnetic moment per unit area Ms·t) of the second pinned magnetic sublayer. Thereby, an exchange coupling magnetic field produced between the first pinned magnetic sublayer and the second pinned magnetic sublayer is not extremely decreased. Consequently, it is possible to prevent an increase in asymmetry or a degradation in reliability. That is, by increasing the thickness of the second pinned magnetic sublayer, it is possible to increase the change in resistance per unit area ΔR·A without degrading reliability and without increasing asymmetry.

Instead of the ferrimagnetic structure, the pinned magnetic layer may be a single film composed of the NiFeX alloy or NiFeCoX alloy, or a laminated film including a sublayer composed of the NiFeX alloy or NiFeCoX alloy and a magnetic sublayer.

The spin-dependent bulk scattering coefficient β of the NiFeX alloy or NiFeCoX alloy constituting the pinned magnetic layer must be defined so as not to decrease the change in resistance per unit area ΔR·A. Specifically, when the nonmagnetic layer is composed of Cu, preferably, the spin-dependent bulk scattering coefficient β of the NiFeX alloy or NiFeCoX alloy constituting the pinned magnetic layer and the spin-dependent bulk scattering coefficient β of the NiFe or NiFeCo base have the same positive or negative sign. That is, preferably, the element X maintains the positive or negative sign of the spin-dependent bulk scattering coefficient β of the NiFe or NiFeCo base. Alternatively, when the nonmagnetic layer is composed of Cr or Ru, preferably, the positive or negative sign of the spin-dependent bulk scattering coefficient β of the NiFeX alloy or NiFeCoX alloy constituting the pinned magnetic layer is opposite that of the spin-dependent bulk scattering coefficient β of the NiFe or NiFeCo base. That is, preferably, the element X reverses the sign of the spin-dependent bulk scattering coefficient β of the NiFe or NiFeCo base.

Preferably, the NiFeX alloy or NiFeCoX alloy constituting the pinned magnetic layer has a higher resistivity than the NiFe or NiFeCo base. In other words, preferably, the element X increases the resistivity of the NiFeX alloy or NiFeCoX alloy from that of the NiFe or NiFeCo base.

If the resistivity of the NiFeX alloy or NiFeCoX alloy is higher than that of the NiFe or NiFeCo base, the spin diffusion length of the NiFeX alloy or NiFeCoX alloy is shorter than that of the NiFe or NiFeCo base. Among magnetic materials having substantially the same spin-dependent bulk scattering coefficient β, the magnetic material having a shorter spin diffusion length makes it possible to further improve the change in resistance per unit area ΔR·A at a small thickness, Therefore, if the material for the pinned magnetic layer is changed from NiFe or NiFeCo to the NiFeX alloy or NiFeCoX alloy, even if the thickness of the pinned magnetic layer is decreased, a decrease in the change in resistance per unit area ΔR·A can be prevented satisfactorily. If the thickness of the pinned magnetic layer is decreased, the magnetic thickness of the pinned magnetic layer is decreased, and therefore the exchange coupling magnetic field is increased, resulting in a further improvement in asymmetry or reliability.

Preferably, X is an element selected from the group consisting of Cu, Au, Ag, Zn, Mn, Al, Cd, Zr, and Hf, as in the CPP giant magnetoresistive element according to the first aspect of the present invention.

The X content in the NiFeX alloy or NiFeCoX alloy is preferably 3 to 40 atomic percent, as in the CPP giant magnetoresistive element according to the first aspect of the present invention. In the NiFe or NiFeCo base into which X is incorporated, preferably, the atomic ratio Ni:Fe is 9:1 to 7:3, and the Co content is 0 to 40 atomic percent.

From a practical point of view, preferably, at least the second pinned magnetic sublayer has a three-layered structure, for example, including an intermediate portion composed of the NiFeX alloy or NiFeCoX alloy, a first CoFe portion under the intermediate portion, and a second CoFe portion on the intermediate portion, the first CoFe portion and the second CoFe portion being thinner than the intermediate portion, so that Ni in the NiFe alloy or NiFeCo alloy does not diffuse into the nonmagnetic layer (Cu). By providing the CoFe portions on a first surface in contact with the nonmagnetic layer and on a second surface opposite to the first surface, it is possible to strengthen an RKKY-like antiparallel coupling between the first pinned magnetic sublayer and the second pinned magnetic sublayer.

The CPP giant magnetoresistive element according to the first aspect or second aspect of the present invention is a single spin-valve structure provided with one set of a multilayer film including a pinned magnetic layer, a nonmagnetic layer, and a free magnetic layer. The present invention is also applicable to a dual spin-valve CPP giant magnetoresistive element provided with two sets of a multilayer film including a pinned magnetic layer, a nonmagnetic layer, and a free magnetic layer. In the dual spin-valve type, since the change in resistance per unit area ΔR·A is two times that of the single spin-valve type, a high output is obtained.

In a third aspect of the present invention, a CPP giant magnetoresistive element includes a multilayer film including a lower pinned magnetic layer, a lower nonmagnetic layer, a free magnetic layer, an upper nonmagnetic layer, and an upper pinned magnetic layer disposed in that order, a current flowing in the thickness direction of the multilayer film, wherein the free magnetic layer is composed of a NiFeX alloy or NiFeCoX alloy, wherein X decreases the saturation magnetization of a NiFe or NiFeCo base.

In a fourth aspect of the present invention, a CPP giant magnetoresistive element includes a multilayer film including a lower pinned magnetic layer, a lower nonmagnetic layer, a free magnetic layer, an upper nonmagnetic layer, and an upper pinned magnetic layer disposed in that order, a current flowing in the thickness direction of the multilayer film, wherein each of the lower pinned magnetic layer and the upper pinned magnetic layer is composed of a NiFeX alloy or NiFeCoX alloy, wherein X decreases the saturation magnetization of a NiFe or NiFeCo base.

More specifically, the lower pinned magnetic layer has a laminated ferrimagnetic structure including a lower first pinned magnetic sublayer and a lower second pinned magnetic sublayer disposed on the lower first pinned magnetic sublayer with a lower nonmagnetic intermediate sublayer therebetween. The upper pinned magnetic layer has a laminated ferrimagnetic structure including an upper first pinned magnetic sublayer and an upper second pinned magnetic sublayer disposed on the upper nonmagnetic layer and under the upper first pinned magnetic sublayer with an upper nonmagnetic intermediate sublayer therebetween. At least the lower second pinned magnetic sublayer and the upper second pinned magnetic sublayer are composed of the NiFeX alloy or NiFeCoX alloy.

DESCRIPTION OF THE PREFERRED EMBODIMENTS

The present invention will be described with reference to the drawings. In each drawing, the X direction corresponds to the track width direction; the Y direction corresponds to the direction of a leakage magnetic field from a recording medium; and the Z direction corresponds to the traveling direction of the recording medium as well as to the lamination direction of the individual layers constituting a giant magnetoresistive element.

Figure 1:
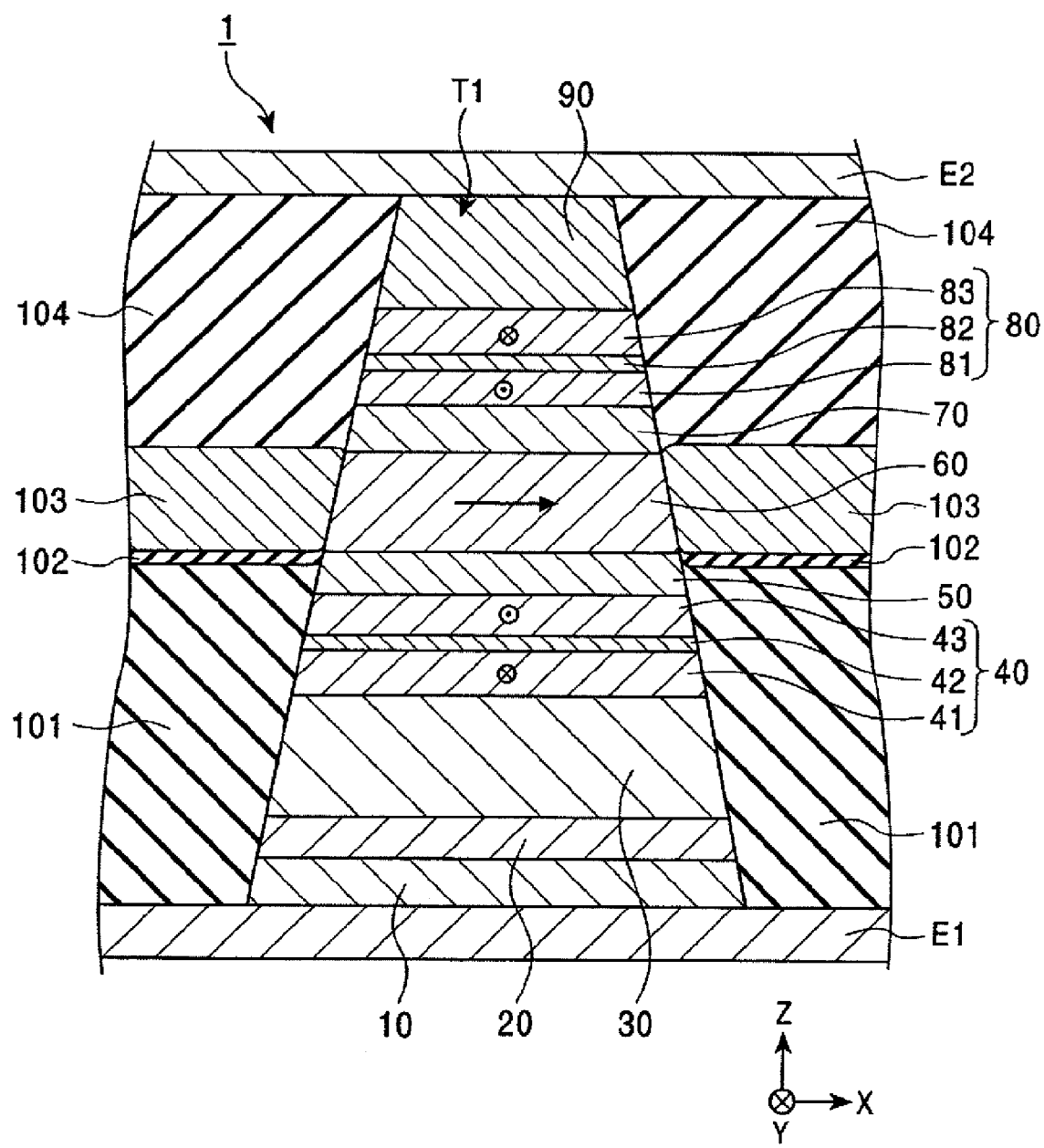
FIG. 1 is a longitudinal sectional view which shows a CPP giant magnetoresistive element (CPP-GMR element) according to an embodiment of the present invention, viewed from the surface facing a recording medium.

FIG. 1 is a partial sectional view which shows a CPP giant magnetoresistive element (CPP-GMR element) according to an embodiment of the present invention, viewed from the surface facing the recording medium. A CPP-GMR element 1 is, for example, mounted on a thin-film magnetic read head for a hard disk drive.

The CPP-GMR element 1 includes a first electrode layer E1 and a second electrode layer E2 which extend in the X direction, and a multi layer film T1 showing a giant magnetoresistance effect, the multilayer film T1 being interposed between the first electrode layer E1 and the second electrode layer E2. In the CPP-GMR element 1, when a sensing current flows in the thickness direction of the individual layers constituting the multilayer film T1, a leakage magnetic field from the recording medium can be detected using the giant magnetoresistance effect. The sensing current flows from either one of the first electrode layer E1 and the second electrode layer E2 to the other.

Each of the first electrode layer E1 and the second electrode layer E2 is composed of a conductive material, such as α-Ta, Au, Cr, Cu, or W. Although not shown in the drawing, the first electrode layer E1 is disposed on a lower shielding layer of a thin-film magnetic read head, and an upper shielding layer of the thin-film magnetic read head is disposed on the second electrode layer E2.

The multilayer film T1 is a so-called "dual spin-valve film" in which an underlayer 10, a seed layer 20, a lower antiferromagnetic layer 30, a lower pinned magnetic layer 40, a lower nonmagnetic layer 50, a free magnetic layer 60, an upper nonmagnetic layer 70, an upper pinned magnetic layer 80, and an upper antiferromagnetic layer 90 are disposed in that order from the bottom.

The underlayer 10 is composed of at least one of Ta, Hf, Nb, Zr, Ti, Mo, and W. The thickness of the underlayer 10 is about 50 Å. However, the underlayer 10 may be omitted.

The seed layer 20 is mainly composed of face-centered cubic crystals, and the (111) planes are preferentially oriented parallel to the interface between the seed layer 20 and the lower antiferromagnetic layer 30. The seed layer 20 is composed of Cr, a NiFe alloy, or a Ni—Fe—Y alloy, wherein Y is at least one element selected from the group consisting of Cr, Rh, Ta, Hf, Nb, Zr, and Ti. By disposing the seed layer 20 composed of such a material on the underlayer 10, the (111) planes are easily oriented parallel to the interface between the seed layer 20 and the lower antiferromagnetic layer 30. The thickness of the seed layer 20 is, for example, about 30 Å. Since the sensing current flows in the thickness direction of the individual layers of the multilayer film T1 in the CPP-GMR element 1, the seed layer 20 is preferably composed of a material with a lower resistivity. However, the seed layer 20 may be omitted.

Each of the lower antiferromagnetic layer 30 and the upper antiferromagnetic layer 90 is composed of an antiferromagnetic material containing Z and Mn, wherein Z is at least one element selected from the group consisting of Pt, Pd, Ir, Rh, Ru, and Os. Alternatively, each of the lower antiferromagnetic layer 30 and the upper antiferromagnetic layer 90 is composed of an antiferromagnetic material containing Z, Z', and Mn, wherein Z' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Such antiferromagnetic materials exhibit superior corrosion resistance and high blocking temperatures and can generate large exchange coupling magnetic fields at the interface between the lower antiferromagnetic layer 30 and the lower pinned magnetic layer 40 or at the interface between the upper antiferromagnetic layer 90 and the upper pinned magnetic layer 80.

The thickness of each of the lower antiferromagnetic layer 30 and the upper antiferromagnetic layer 90 is preferably 80 to 300 Å. In this embodiment, each of the lower antiferromagnetic layer 30 and the upper antiferromagnetic layer 90 has a thickness of about 200 Å.

The lower pinned magnetic layer 40 has a three-layered ferrimagnetic structure including a lower first pinned magnetic sublayer 41, a lower second pinned magnetic sublayer 43, and a lower nonmagnetic intermediate sublayer 42 interposed between the lower first pinned magnetic sublayer 41 and the lower second pinned magnetic sublayer 43. Similarly, the upper pinned magnetic layer 80 has a three-layered ferrimagnetic structure including an upper first pinned magnetic sublayer 83, an upper second pinned magnetic sublayer 81, and an upper nonmagnetic intermediate sublayer 82 interposed between the upper first pinned magnetic sublayer 83 and the upper second pinned magnetic sublayer 81.

In this embodiment, the lower pinned magnetic layer 40 and the upper pinned magnetic layer 80 have the same structure. Hereinafter, for the convenience of description, each of the lower first pinned magnetic sublayer 41 and the upper first pinned magnetic sublayer 83 is simply referred to as the "first pinned magnetic sublayer", each of the lower nonmagnetic intermediate sublayer 42 and the upper nonmagnetic intermediate sublayer 82 is simply referred to as the "nonmagnetic intermediate sublayer", and each of the lower second pinned magnetic sublayer 43 and the upper second pinned magnetic sublayer 81 is simply referred to as the "second pinned magnetic sublayer".

The magnetization direction of each of the first pinned magnetic sublayers 41 and 83 is pinned in the height direction (in the Y direction) by an exchange anisotropic magnetic field generated between the first pinned magnetic sublayer 41 and the lower antiferromagnetic layer 30 or between the first pinned magnetic sublayer 83 and the upper antiferromagnetic layer 90. The magnetization direction of each of the second pinned magnetic sublayers 43 and 81 is pinned in a direction opposite to the height direction due to the RKKY interaction with each of the first pinned magnetic sublayers 41 and 83 through each of the nonmagnetic intermediate sublayers 42 and 82.

Each of the first pinned magnetic sublayers 41 and 83 and the second pinned magnetic sublayers 43 and 81 has a thickness of about 10 to 70 Å. Each of the nonmagnetic intermediate sublayers 42 and 82 has a thickness that allows the RKKY interaction to occur between the first pinned magnetic sublayer 41 or 83 and the second pinned magnetic sublayer 43 or 81, i.e., a thickness of about 3 to 10 Å. In this embodiment, the nonmagnetic intermediate sublayers 42 and 82 are composed of Ru.

When each of the lower pinned magnetic layer 40 and the upper pinned magnetic layer 80 has such a laminated ferrimagnetic structure, the magnetizations of the lower pinned magnetic layer 40 and the upper pinned magnetic layer 80 can be stabilized, and the magnetization directions of the lower pinned magnetic layer 40 and the upper pinned magnetic layer 80 can be strongly pinned. Instead of the laminated ferrimagnetic structure, each of the lower pinned magnetic layer 40 and the upper pinned magnetic layer 80 may be composed of a single film or a laminated film including magnetic sublayers only.

Each of the lower nonmagnetic layer 50 and the upper nonmagnetic layer 70 is preferably composed of a conductive material with low electrical resistance, and is composed of Cu in this embodiment. The thickness of each of the lower nonmagnetic layer 50 and the upper nonmagnetic layer 70 has a thickness of, for example, about 25 to 50 Å.

In this embodiment, the free magnetic layer 60 does not have a laminated ferrimagnetic structure and is composed of a laminated film including soft magnetic materials. Hard bias layers 103 which are magnetized in the track width direction are disposed in contact with both side faces of the free magnetic layer 60. The magnetization of the free magnetic layer 60 is aligned in the track width direction (in the X direction) by the longitudinal bias magnetic fields of the hard bias layers 103. Additionally, the free magnetic layer 60 may have a laminated ferrimagnetic structure or may be composed of a single film of a soft magnetic material.

At both sides in the track width direction of the multilayer film T1, first insulating layers 101, bias underlayers 102, the hard bias layers 103, and second insulating layers 104 are disposed in that order on the first electrode layer E1.

The first insulating layers 101 are disposed on the first electrode layer E1 so as to be in contact with both sides of the individual layers from the under layer 10 to the lower nonmagnetic layer 50. The second insulating layers 104 are disposed on the hard bias layers 103 so as to be in contact with both sides of the individual layers from the upper nonmagnetic layer 70 to the upper antiferromagnetic layer 90. In this embodiment, the thickness of the first insulating layer 101 is set so that the upper surface of the first insulating layer 101 is placed lower than the lower surface of the free magnetic layer 60 as shown in FIG. 1. The upper surfaces of the second insulating layers 104 and the upper surface of the upper antiferromagnetic layer 90 are placed so as to form a continuous plane, and the second electrode layer E2 extends over the second insulating layers 104 and the upper antiferromagnetic layer 90. Each of the first insulating layer 101 and the second insulating layer 104 is composed of an insulating material, such as $Al_2O_3$ or $SiO_2$.

The bias underlayer 102 is provided to improve the characteristics (coercive force Hc and remanence ratio S) of the hard bias layer 103 and increase the bias magnetic field produced by the hard bias layer 103. The bias underlayer 102 is preferably composed of a metal having a body-centered cubic structure (bcc structure), and specifically, is preferably composed of at least one element selected from the group consisting of Cr, W, Mo, V, Mn, Nb, and Ta. Furthermore, the (100) planes of the crystals of the bias underlayer 102 are preferentially oriented.

As described above, the hard bias layers 103 are in contact with both side faces of the free magnetic layer 60 and are magnetized in the track width direction (in the X direction). The hard bias layer 103 is composed of a CoPt alloy, a CoPtCr alloy, or the like. The crystals of these alloys have only a hexagonal close-packed (hcp) structure or a mixture of a face-centered cubic (fcc) structure and a hcp structure.

If the hard bias layer 103 is formed on the bias underlayer 102, the atomic arrangement of the metal having the bcc structure constituting the bias underlayer 102 becomes close to the atomic arrangement of the CoPt-based alloy having the hcp structure constituting the hard bias layer 103 at the interface. Therefore, in the CoPt-based alloy, the fcc structure is not easily formed, and the hcp structure is easily formed. Since the c-axis of the hcp structure is preferentially oriented within the boundary between the CoPt-based alloy and the bias underlayer 102, the remanence is increased and the remanence ratio S is increased. Moreover, since the hcp structure has a larger magnetic anisotropy in the c-axis direction compared to the fcc structure, the coercive force He is increased when a magnetic field is applied to the hard bias layer 103.

The bias underlayer 102 is preferably formed only under the hard bias layer 103. The bias underlayer 102 may be slightly interposed between the side face of the free magnetic layer 60 and the hard bias layer 102. In such a case, the thickness in the track width direction of the portion of the bias underlayer 102 formed between the side face of the free magnetic layer 60 and the hard bias layer 103 is preferably 1 nm or less. However, if the bias underlayers 102 are not interposed between both side faces of the free magnetic layer 60 and the hard bias layers 102, the hard bias layers 103 and the free magnetic layer 60 can form a magnetic continuum. Thereby, a buckling phenomenon in which the ends of the free magnetic layer 60 are influenced by the demagnetizing fields, and the magnetic domains of the free magnetic layer 60 can be easily controlled.

In the CPP-GMR element 1, each of the free magnetic layer 60 and the second pinned magnetic sublayers 43 and 81 are composed of a NiFeX alloy or NiFeCoX alloy which has a lower saturation magnetization than that of NiFe. The NiFeX alloy or NiFeCo alloy is prepared by incorporating X into a NiFe or NiFeCo base.

Figure 2:
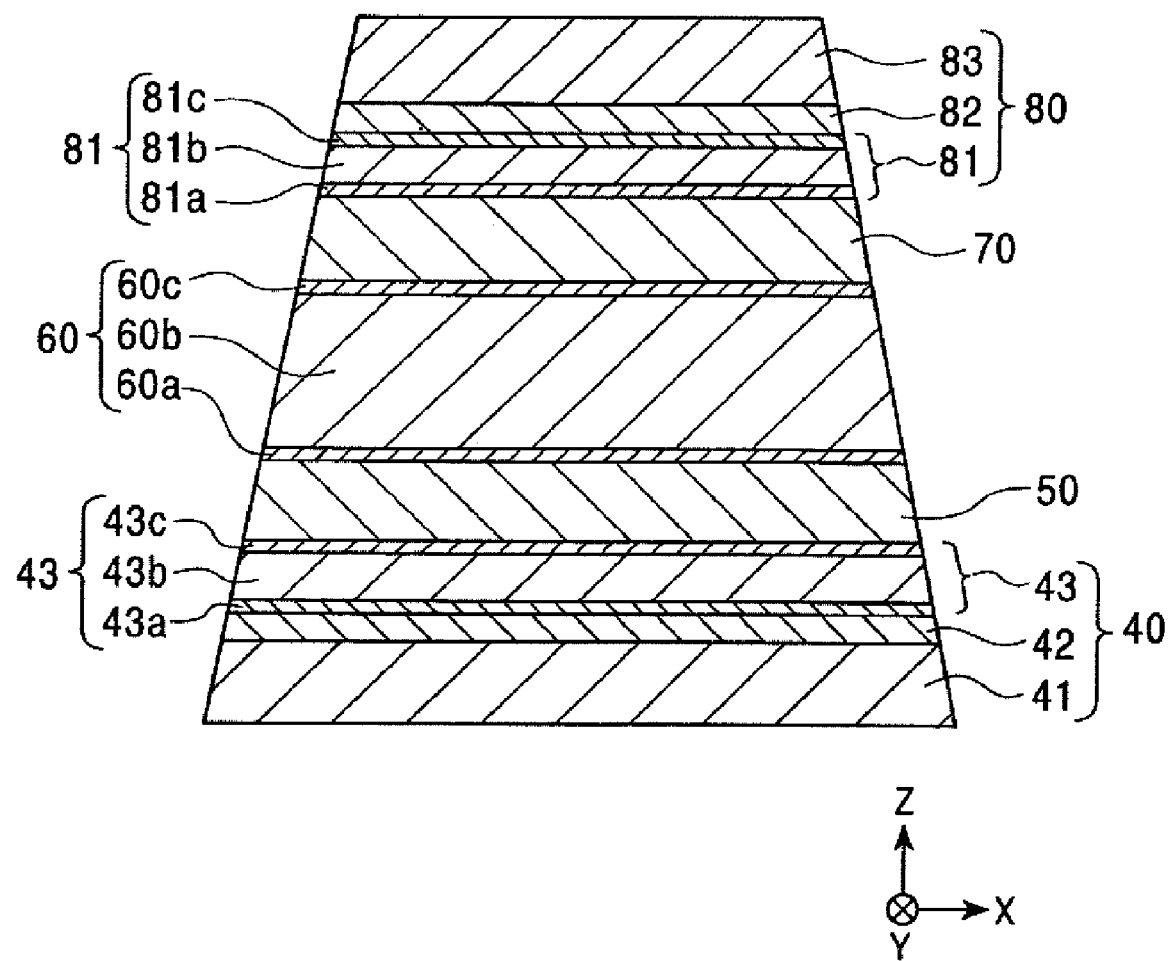
FIG. 2 is an enlarged partial sectional view which shows a free magnetic layer and second pinned magnetic sublayers shown in FIG. 1.

FIG. 2 is an enlarged partial sectional view which shows the free magnetic layer 60 and the second pinned magnetic sublayers 43 and 81 in the multi layer film T1.

In this embodiment, each of the free magnetic layer 60 and the second pinned magnetic sublayers 43 and 81 includes a CoFe portion as a diffusion-preventing layer for preventing the diffusion of Ni of the NiFeX alloy or NiFeCoX alloy. That is, each of the free magnetic layer 60 and the second pinned magnetic sublayers 43 and 81 has a three-layered structure including an intermediate portion (60b, 43b, or 81b) composed of the NiFeX alloy or NiFeCoX alloy, a first CoFe portion (60a, 43a, or 81a) disposed under the intermediate portion, and a second CoFe portion (60c, 43c, or 81c) disposed on the intermediate portion. Since the thickness of each of the first CoFe portion and the second CoFe portion is smaller than the thickness of the intermediate portion, the magnetic properties of each of the free magnetic layer 60 and the second pinned magnetic sublayers 43 and 81 are substantially determined by the intermediate portions, i.e., the NiFeX alloy or NiFeCoX alloy.

The element X incorporated into the NiFe or NiFeCo base decreases the saturation magnetization of the NiFe or NiFeCo base.

Since the element X decreases the saturation magnetization of the NiFe or NiFeCo base, the NiFeX alloy or NiFeCoX alloy containing X has a lower saturation magnetization than that of the NiFe or NiFeCo base. Consequently, by forming each of the free magnetic layer 60 and the second pinned magnetic sublayers 43 and 81 using the NiFeX alloy or NiFeCoX alloy, the saturation magnetization of each of the free magnetic layer 60 and the second pinned magnetic sublayers 43 and 81 is decreased compared with the case in which each of the free magnetic layer 60 and the second pinned magnetic sublayers 43 and 81 is formed using NiFe or NiFeCo. Consequently, even if the thickness of each of the free magnetic layer 60 and the second pinned magnetic sublayers 43 and 81 is increased in order to increase the change in resistance per unit area ΔR·A, an increase in the magnetic thickness can be properly suppressed.

Even if the thickness of the free magnetic layer 60 is physically increased, if the increase in the magnetic thickness of the free magnetic layer 60 can be suppressed, the magnetization of the free magnetic layer 60 does not become less rotatable in response to an external magnetic field, and the output sensitivity is improved. Even if the thickness of each of the second pinned magnetic sublayers 43 and 81 is physically increased, if the increase in the magnetic thickness of each of the second pinned magnetic sublayers 43 and 81 can be suppressed, a decrease in the exchange coupling magnetic field applied between the first pinned magnetic sublayer 41 or 83 and the second pinned magnetic sublayer 43 or 81 through the nonmagnetic intermediate sublayer 42 or 82 can be suppressed, and thereby asymmetry and reliability can be improved. Consequently, it is possible to increase the change in resistance per unit area ΔR·A without degrading output sensitivity or reliability and without increasing asymmetry.

The change in resistance per unit area ΔR·A also varies depending on the combination of positive and negative signs of the spin-dependent bulk scattering coefficients β of the individual layers (the pinned magnetic layers, the nonmagnetic layers, and the free magnetic layer) which contribute to the giant magnetoresistance effect.

The element X incorporated into the NiFe or NiFeCo base is preferably selected so as not to reduce the change in resistance per unit area ΔR·A (which is related to the difference in the mobility between spin-up conduction electrons and spin-down conduction electrons) as well as so as to decrease the saturation magnetization of the NiFe or NiFeCo base.

The spin-dependent bulk scattering coefficient β is a value inherent in a magnetic material, the coefficient satisfying the relationship $\rho\downarrow/\rho\uparrow=(1+\beta)/(1-\beta)$, wherein $-1\leq\beta\leq1$. $\rho\downarrow$ is the resistivity to minority conduction electrons among the conduction electrons flowing through the magnetic material, and $\rho\uparrow$ is the resistivity to majority conduction electrons among the conduction electrons flowing through the magnetic material.

The magnetic moments of magnetic atoms constituting a magnetic material are dependent on the orbital magnetic moments and spin magnetic moments of electrons primarily in the 3d orbital or 4f orbital. The number of spin-up electrons and the number of spin-down electrons present in the 3d orbital or 4f orbital are fundamentally different. Among the spin-up electrons and spin-down electrons present in the 3d orbital or 4f orbital, one spin state shown by a larger number of electrons is referred to as a majority spin, and the other spin state shown by a smaller number of electrons is referred to as a minority spin. On the other hand, substantially the same number of spin-up conduction electrons and spin-down conduction electrons are included in a current flowing through the magnetic material. Among the spin-up conduction electrons and spin-down conduction electrons, the conduction electrons having the same spin state as that of the majority spin of the magnetic material are referred to as majority conduction electrons, and the conduction electrons having the same spin state as that of the minority spin of the magnetic material are referred to as minority conduction electrons.

When the spin-dependent bulk scattering coefficient β is positive (β>0), $\rho\downarrow>\rho\uparrow$, and majority conduction electrons flow more easily through the magnetic material. On the other hand, when the spin-dependent bulk scattering coefficient β is negative (β<0), $\rho\downarrow<\rho\uparrow$, and minority conduction electrons flow more easily through the magnetic material.

In order to increase the change in resistance per unit area ΔR·A, the difference between the resistivity to spin-up conduction electrons and the resistivity to spin-down conduction electrons must be increased. That is, the signs of the spin-dependent bulk scattering coefficients β and the spin-dependent interface scattering coefficients γ of the individual layers (the lower pinned magnetic layer 40, the lower nonmagnetic layer 50, the free magnetic layer 60, the upper nonmagnetic layer 70, and the upper pinned magnetic layer 80) contributing to the giant magnetoresistance effect must be combined so that the resistivity to spin-up conduction electrons is lower than the resistivity to spin-down conduction electrons or the resistivity to spin-down conduction electrons is lower than the resistivity to spin-up conduction electrons with respect to all the magnetic layers.

In this embodiment, each of the lower nonmagnetic layer 50 and the upper nonmagnetic layer 70 is composed of Cu (i.e., the spin-dependent interface scattering coefficient γ>0 at the interface between Cu and NiFe or between Cu and NiFeCo), and each of the free magnetic layer 60 and the second pinned magnetic sublayers 43 and 81 is composed of the NiFeX alloy or NiFeCoX alloy instead of NiFe or NiFeCo. Therefore, the spin-dependent bulk scattering coefficient β of the NiFeX alloy or NiFeCoX alloy must have the same sign as that of the spin-dependent bulk scattering coefficient β of NiFe. Since the spin-dependent bulk scattering coefficient β of NiFe is positive, an element having a positive spin-dependent bulk scattering coefficient β is selected as X.

If the spin-dependent bulk scattering coefficient β of the NiFeX alloy or NiFeCoX alloy is defined as described above, even if the material for the free magnetic layer is changed from NiFe or NiFeCo to the NiFeX alloy or NiFeCoX alloy, the change in resistance per unit area ΔR·A can be maintained satisfactorily.

As the spin-dependent bulk scattering coefficient β of a magnetic material is increased, conduction electrons flowing through the magnetic material are more easily scattered, and the change in resistance per unit area $\Delta R \cdot A$ is increased. Therefore, preferably, the element X does not excessively decrease the spin-dependent bulk scattering coefficient $\beta$ of NiFe.

Furthermore, preferably, the element X which is incorporated into the NiFe or NiFeCo base increases the resistivity of the NiFeX alloy or NiFeCoX alloy to a value higher than the resistivity of the NiFe or NiFeCo base. In such a case, it is possible to shorten the spin diffusion length of conduction electrons flowing through the free magnetic layer 60 and the second pinned magnetic sublayers 43 and 81. The spin diffusion length corresponds to a distance during which conduction electrons move through a conductive material without changing the direction of their spin. The spin diffusion length decreases as the resistivity of the magnetic material increases.

According to the Vallet & Fert model (Physical Review B, vol. 48, 1993, 7099-), assuming the same spin-dependent bulk scattering coefficient $\beta$, by using a magnetic material having a shorter spin diffusion length, it is expected that the change in resistance per unit area $\Delta R \cdot A$ at a small thickness can be further improved.

Consequently, if X is an element which decreases the saturation magnetization of NiFe or NiFeCo and which increases the resistivity while maintaining a value $\beta$ close to the spin-dependent bulk scattering coefficient $\beta$ of NiFe, even if the thickness of each of the free magnetic layer 60 and the second pinned magnetic sublayers 43 and 81 is decreased, it is possible to maintain the change in resistance per unit area $\Delta R \cdot A$ satisfactorily. If the thickness of the free magnetic layer 60 is decreased, the magnetic thickness thereof is further decreased, resulting in a further improvement in the output sensitivity. If the thickness of each of the second pinned magnetic sublayers 43 and 81 is decreased, the magnetic thickness thereof is further decreased, and thereby a decrease in the exchange coupling magnetic field can be more effectively suppressed.

Specifically, X may be any one of Cu, Au, Ag, Zn, Mn, Al, Cd, Zr, and Hf. In particular, Cu or Au is preferable because of its compatibility with NiFe.

The elements described above satisfy all of the following conditions:

(1) the saturation magnetization of the NiFe or NiFeCo base is decreased;

(2) when the nonmagnetic layer is composed of Cu, the positive or negative sign of the spin-dependent bulk scattering coefficient $\beta$ of the NiFe or NiFeCo base is maintained; and (3) the resistivity of the NiFeX alloy or NiFeCoX alloy is increased from that of the NiFe or NiFeCo base.

The X content is set at about 3 to 40 atomic percent with respect to NiFe or NiFeCo. When the X content is within the range described above, the saturation magnetization of the NiFe or NiFeCo base can be properly decreased. If the X content is less than 3 atomic percent, the saturation magnetization of the NiFe or NiFeCo base is not decreased, and the incorporation of X becomes not effective. If the X content exceeds 40 atomic percent, the saturation magnetization of the NiFe or NiFeCo base is excessively decreased, and the Curie temperature is decreased, resulting in thermal instability.

In the NiFe or NiFeCo base into which X is incorporated, preferably, the atomic ratio Ni:Fe is about 9:1 to about 7:3, and the Co content is about 0 to 40 atomic percent. Within the ranges described above, the crystal magnetic anisotropy and the linear magnetostriction constants $\lambda 100$ and $\lambda 111$ in the <100> direction and in the <111> direction are not extremely increased from the those of NiFe, and soft magnetic properties are maintained satisfactorily. Therefore, the rotatability of the magnetization of the free magnetic layer 60 (output sensitivity) is not affected.

With reference to Tables 1 and 2, Examples 1 to 4 of the present invention which are CPP-GMR elements having the structure shown in FIG. 1 is used and Comparative Examples 1 and 2 (conventional examples) will be described.

Comparative Examples 1 and 2 are CPP-GMR elements having the same layer structure as that of Examples 1 to 4 (shown in FIG. 1). In Comparative Examples 1 and 2, the materials and thicknesses of the individual layers other than the free magnetic layer 60 and the intermediate portions of the second pinned magnetic sublayers 43 and 81 are the same as those in Examples 1 to 4. The first pinned magnetic sublayers 41 and 83 are composed of CoFe, the nonmagnetic intermediate sublayers 42 and 82 are composed of Ru, and the lower nonmagnetic layer 50 and the upper nonmagnetic layer 70 are composed of Cu.

In Examples 1 to 4 and Comparative Examples 1 and 2, materials constituting the intermediate portions of the free magnetic layer 60 and the second pinned magnetic sublayers 43 and 81 are different and the thicknesses of the intermediate portions are different.

Table 1 shows the materials for and the thicknesses of the second pinned magnetic sublayers 43 and 81 and the free magnetic layer 60 in Examples 1 to 4 and Comparative Examples 1 and 2. In Table 1, the value in parentheses after the composition formula represents the thickness (Å).

TABLE 1

|  | Second pinned magnetic sublayer | Free magnetic layer |
| --- | --- | --- |
| Comparative Example 1 | $Co_{90}Fe_{10}(10)/Ni_{80}Fe_{20}(35)/Co_{90}Fe_{10}(5)$ | $Co_{90}Fe_{10}(5)/Ni_{80}Fe_{20}(100)/Co_{90}Fe_{10}(5)$ |
| Comparative Example 2 | $Co_{90}Fe_{10}(10)/Ni_{80}Fe_{20}(20)/Co_{90}Fe_{10}(5)$ | $Co_{90}Fe_{10}(5)/Ni_{80}Fe_{20}(30)/Co_{90}Fe_{10}(5)$ |
| Example 1 | $Co_{90}Fe_{10}(10)/(Ni_{0.8}Fe_{0.2})_{89}Cu_{11}(55)/Co_{90}Fe_{10}(5)$ | $Co_{90}Fe_{10}(5)/(Ni_{0.8}Fe_{0.2})_{89}Cu_{11}(109)/Co_{90}Fe_{10}(5)$ |
| Example 2 | $Co_{90}Fe_{10}(10)/(Ni_{0.8}Fe_{0.2})_{80}Cu_{20}(62)/Co_{90}Fe_{10}(5)$ | $Co_{90}Fe_{10}(5)/(Ni_{0.8}Fe_{0.2})_{80}Cu_{20}(122)/Co_{90}Fe_{10}(5)$ |
| Example 3 | $Co_{90}Fe_{10}(10)/(Ni_{0.8}Fe_{0.2})_{89}Cu_{11}(18)/Co_{90}Fe_{10}(5)$ | $Co_{90}Fe_{10}(5)/(Ni_{0.8}Fe_{0.2})_{89}Cu_{11}(28)/Co_{90}Fe_{10}(5)$ |
| Example 4 | $Co_{90}Fe_{10}(10)/(Ni_{0.8}Fe_{0.2})_{80}Cu_{20}(19)/Co_{90}Fe_{10}(5)$ | $Co_{90}Fe_{10}(5)/(Ni_{0.8}Fe_{0.2})_{80}Cu_{20}(29)/Co_{90}Fe_{10}(5)$ |

In all of Examples and Comparative Examples, each of the free magnetic layer 60 and the second pinned magnetic sublayers 43 and 81 has a three-layered structure composed of a first CoFe portion/an intermediate portion/a second CoFe portion. The thickness of each of the first CoFe portion 60a and the second CoFe portion 60c is 5 Å so that diffusion is prevented between Ni and the nonmagnetic layer (Cu) 50 or 70. On the other hand, in each of the second pinned magnetic sublayers 43 and 81, the thickness of each of the first CoFe portion 43a and the second CoFe portion 81c in contact with the lower nonmagnetic intermediate sublayer 42 or the upper nonmagnetic intermediate sublayer 82 is set at about 10 Å so that a large RKKY interaction between the first CoFe portion 43a and the lower first pinned magnetic sublayer 41 or between the second CoFe portion 81c and the upper first pinned magnetic sublayer 83 is maintained. Each of the second CoFe portion 43c and the first CoFe portion 81a is set at about 5 Å so that diffusion is prevented between Ni and the nonmagnetic layer (Cu) 50 or 70. In each of the first CoFe portion and the second CoFe portion, the atomic ratio Co:Fe is 90:10.

COMPARATIVE EXAMPLE 1

In Comparative Example 1, in each of the free magnetic layer 60 and the second pinned magnetic sublayers 43 and 81, the intermediate portion 60b, 43b, or 81b is composed of $Ni_{80}Fe_{20}$. The thickness of the NiFe portion (intermediate portion 60b) in the free magnetic layer 60 is 100 Å, and the total thickness of the free magnetic layer 60 is 110 Å. The thickness of the NiFe portion (intermediate portion 43b or 81b) in each of the second pinned magnetic sublayers 43 and 81 is 35 Å, and the total thickness of each of the second pinned magnetic sublayer 43 and 81 is 50 Å.

COMPARATIVE EXAMPLE 2

Comparative Example 2 has the same film structure as that of Comparative Example 1. The thickness of the NiFe portion (intermediate portion 43b, 81b, or 60b) in each of the free magnetic layer 60 and the second pinned magnetic sublayers 43 and 81 is smaller than that in Comparative Example 1. That is, the thickness of the NiFe portion in the free magnetic layer 60 is 30 Å, and the total thickness of the free magnetic layer 60 is 40 Å. The thickness of the NiFe portion in each of the second pinned magnetic sublayers 43 and 81 is 20 Å, and the total thickness of each of the second pinned magnetic sublayers 43 and 81 is 35 Å.

In Examples 1 to 4, the intermediate portion 60b, 43b, or 81b in each of the free magnetic layer 60 and the second pinned magnetic sublayers 43 and 81 is composed of a NiFeCu alloy. Each Example has a different Cu content (atomic percent) in the NiFeCu alloy and a different thickness of the NiFeCu portion (intermediate portion 43b, 81b, or 60b). In the NiFe base for the NiFeCu alloy, the atomic ratio Ni:Fe is 0.8:0.2, which is the same as that of NiFe constituting the intermediate portion in Comparative Example 1 or 2.

EXAMPLE 1

In Example 1, the Cu content in the NiFeCu alloy constituting each of the intermediate portions 60b, 43b, and 81b in the free magnetic layer 60 or the second pinned magnetic sublayers 43 and 81 is 11 atomic percent. The thickness of each of the free magnetic layer 60 and the second pinned magnetic sublayers 43 and 81 is larger than that in Comparative Example 1. The thickness of the NiFeCu portion (intermediate portion 60b) in the free magnetic layer 60 is 109 Å, and the total thickness of the free magnetic layer 60 is 119 Å. The thickness of the NiFeCu portion (intermediate portion 43b or 81b) in each of the second pinned magnetic sublayers 43 and 81 is 55 Å, and the total thickness of each of the second pinned magnetic sublayers 43 and 81 is 70 Å.

EXAMPLE 2

In Example 2, the Cu content in the NiFeCu alloy constituting each of the intermediate portions 60b, 43b, and 81b in the free magnetic layer 60 or the second pinned magnetic sublayers 43 and 81 is 20 atomic percent. The thickness of each of the free magnetic layer 60 and the second pinned magnetic sublayers 43 and 81 is larger than that in Comparative Example 1. The thickness of the NiFeCu portion (intermediate portion 60b) in the free magnetic layer 60 is 122 Å, and the total thickness of the free magnetic layer 60 is 132 Å. The thickness of the NiFeCu portion (intermediate portion 43b or 81b) in each of the second pinned magnetic sublayers 43 and 81 is 62 Å, and the total thickness of each of the second pinned magnetic sublayers 43 and 81 is 77 Å.

EXAMPLE 3

In Example 3, the Cu content in the NiFeCu alloy constituting each of the intermediate portions 60b, 43b, and 81b in the free magnetic layer 60 or the second pinned magnetic sublayers 43 and 81 is 11 atomic percent. The thickness of each of the free magnetic layer 60 and the second pinned magnetic sublayers 43 and 81 is smaller than that in Comparative Example 2. The thickness of the NiFeCu portion (intermediate portion 60b) in the free magnetic layer 60 is 28 Å, and the total thickness of the free magnetic layer 60 is 38 Å. The thickness of the NiFeCu portion (intermediate portion 43b or 81b) in each of the second pinned magnetic sublayers 43 and 81 is 18 Å, and the total thickness of each of the second pinned magnetic sublayers 43 and 81 is 33 Å.

EXAMPLE 4

In Example 4, the Cu content in the NiFeCu alloy constituting each of the intermediate portions 60b, 43b, and 81b in the free magnetic layer 60 or the second pinned magnetic sublayers 43 and 81 is 20 atomic percent. The thickness of each of the free magnetic layer 60 and the second pinned magnetic sublayers 43 and 81 is smaller than that in Comparative Example 2. The thickness of the NiFeCu portion (intermediate portion 60b) in the free magnetic layer 60 is 29 Å, and the total thickness of the free magnetic layer 60 is 39 Å. The thickness of the NiFeCu portion (intermediate portion 43b or 81b) in each of the second pinned magnetic sublayers 43 and 81 is 19 Å, and the total thickness of each of the second pinned magnetic sublayers 43 and 81 is 34 Å.

In each of Comparative Examples and Examples, the change in resistance per unit area $\Delta R \cdot A$ [$m\Omega \cdot \mu m^2$], the magnetic thickness Ms·t [T·nm] of the free magnetic layer, the magnetic thickness Ms·t [T·nm] of the second pinned magnetic sublayer, and the exchange coupling magnetic field Hex* [kA/m] measured based on the magnetoresistance curve (R-H curve) showing the magnetic reversal of the second pinned magnetic sublayer are measured and calculated. The results thereof are shown in Table 2 below.

TABLE 2

| | Change in resistance per unit area $\Delta R \cdot A$ [$m\Omega \cdot \mu m^2$] | Magnetic thickness of free magnetic layer Ms · t [T · nm] | Magnetic thickness of second pinned magnetic sublayer Ms · t [T · nm] | Exchange coupling magnetic field Hex* [kA/m] |
|---|---|---|---|---|
| (a) Comparative Example 1 | 1.98 | 9.85 | 5.17 | 111.0 |
| (b) Comparative Example 2 | 0.85 | 4.53 | 3.92 | 177.7 |

TABLE 2-continued

|  | Change in resistance per unit area ΔR·A [mΩ·μm²] | Magnetic thickness of free magnetic layer Ms·t [T·nm] | Magnetic thickness of second pinned magnetic sublayer Ms·t [T·nm] | Exchange coupling magnetic field Hex* [kA/m] |
|---|---|---|---|---|
| (c) Example 1 | 2.30 | 9.30 | 6.19 | 95.2 |
| (d) Example 2 | 2.16 | 8.58 | 5.85 | 103.4 |
| (e) Example 3 | 1.12 | 4.17 | 3.54 | 219.0 |
| (f) Example 4 | 1.14 | 3.99 | 3.35 | 227.5 |

With respect to Example 1 and Example 2 shown in Table 2 (c) and (d), the thickness of each of the free magnetic layer 60 and the second pinned magnetic sublayers 43 and 81 is larger than that in Comparative Example 1, and as a result, the change in resistance per unit area ΔR·A is larger than that in Comparative Example 1 (Table 2 (a)). If the thickness of each of the free magnetic layer 60 and the second pinned magnetic sublayers 43 and 81 is increased, the magnetic thickness should be increased. However, the magnetic thickness of the free magnetic layer 60 is lower than that in Comparative Example 1. The reason for this is thought to be the fact that the free magnetic layer 60 is composed of NiFeCu having a lower saturation magnetization than that of NiFe. Specifically, in Example 1 in which the Cu content is 11 atomic percent, the saturation magnetization of NiFeCu is about 86% of NiFe. In Example 2 in which the Cu content is 20 atomic percent, the saturation magnetization of NiFeCu is about 70% of NiFe. Similarly, in each of Examples 1 and 2, although the thickness of each of the second pinned magnetic sublayers 43 and 81 is larger than that in Comparative Example 1, an increase in the magnetic thickness in the second pinned magnetic sublayer 43 or 81 is suppressed, and as a result, the exchange coupling magnetic field is not substantially decreased.

As is evident from the results described above, in each of Examples 1 and 2, it is possible to increase the change in resistance per unit area ΔR·A compared to Comparative Example 1, and it is also possible to properly suppress an increase in the magnetic thickness so that output sensitivity, asymmetry, and reliability can be improved.

With respect to Example 3 and Example 4 shown in Table 2 (e) and (f), the thickness of each of the free magnetic layer 60 and the second pinned magnetic sublayers 43 and 81 is greatly decreased from that in Example 1 or 2. Therefore, the change in resistance per unit area ΔR·A is smaller than that in Example 1 or 2 in which the thickness of each of the free magnetic layer 60 and the second pinned magnetic sublayers 43 and 81 is larger. However, the change in resistance per unit area ΔR·A is larger than that in Comparative Example 2 (Table 2 (b)) in which the thickness of each of the free magnetic layer 60 and the second pinned magnetic sublayers 43 and 81 is substantially the same. In view of the very small thickness of each of the free magnetic layer 60 and the second pinned magnetic sublayers 43 and 81, the change in resistance per unit area ΔR·A is maintained at a relatively high value. The reason for this is thought to be the fact that the resistivity of NiFeCu constituting each of the free magnetic layer 60 and the second pinned magnetic sublayers 43 and 81 is higher than the resistivity of NiFe.

With reference to Table 2, in Comparative Example 2, the thickness of each of the free magnetic layer 60 and the second pinned magnetic sublayers 43 and 81 is smaller than that in Comparative Example 1, and the change in resistance per unit area ΔR·A is also smaller than that in Comparative Example 1. The rate of decrease in the change in resistance per unit area ΔR·A is about 57%. In contrast, the rate of decrease in the change in resistance per unit area ΔR·A in Example 3 or 4 is smaller than that in Comparative Example 2 at about 50%.

In each of Examples 3 and 4, since the thickness of each of the free magnetic layer 60 and the second pinned magnetic sublayers 43 and 81 is smaller than that in Example 1 or 2, the magnetic thickness of the free magnetic layer 60 is decreased to less than half the magnetic thickness in Example 1 or 2. Similarly, the magnetic thickness of the second pinned magnetic sublayer 43 or 81 is decreased, and as a result, the exchange coupling magnetic field is also greatly increased to more than two times the value in Example 1 or 2.

As is evident from the results described above, in each of Examples 3 and 4, it is possible to maintain a larger change in resistance per unit area ΔR·A compared to Example 2 in which the thickness of each of the each of the free magnetic layer 60 and the second pinned magnetic sublayers 43 and 81 is substantially the same as that in Example 3 or 4. The magnetic thickness of each of the free magnetic layer 60 and the second pinned magnetic sublayers 43 and 81 is decreased compared to Comparative Example 1 or 2 in which the magnetic thickness of each of the free magnetic layer 60 and the second pinned magnetic sublayers 43 and 81 is relatively large, and thereby it is possible to further improve output sensitivity, asymmetry, and reliability.

A method for fabricating a CPP-GMR element 1 shown in FIG. 1 will now be described below.

First, on a first electrode layer E1, an underlayer 10, a seed layer 20, a lower antiferromagnetic layer 30, a lower first pinned magnetic sublayer 41, a lower nonmagnetic intermediate sublayer 42, a lower second pinned magnetic sublayer 43, a lower nonmagnetic layer 50, a free magnetic layer 60, an upper nonmagnetic layer 70, an upper second pinned magnetic sublayer 81, an upper nonmagnetic intermediate sublayer 82, an upper first pinned magnetic sublayer 83, and an upper antiferromagnetic layer 90 are continuously deposited in a vacuum in that order from the bottom as a solid film. A layered structure of a multilayer film T1 is thereby formed. The materials for and the thicknesses of the individual layers are the same as those of the finished CPP-GMR element 1 shown in FIG. 1.

Next, the multilayer film T1 is annealed in a magnetic field oriented in the height direction (in the Y direction) so that exchange coupling magnetic fields are generated between the lower antiferromagnetic layer 30 and the lower first pinned magnetic sublayer 41 and between the upper antiferromagnetic layer 90 and the upper first pinned magnetic sublayer 83. For example, the annealing temperature is set at about 270° C., and the magnitude of the magnetic field is set at about 800 kA/m. By such an annealing process in the magnetic field, the magnetization directions of the lower first pinned magnetic sublayer 41 and the upper first pinned magnetic sublayer 83 are pinned in the height direction, and the magnetization directions of the lower second pinned magnetic sublayer 43 and the upper second pinned magnetic sublayer 81 are pinned in a direction antiparallel to the height direction.

Subsequently, a resist layer for a lift-off process is formed on the upper antiferromagnetic layer 90 so as to cover an area that is substantially the same as the optical element area of the GMR element to be formed or an area that is slightly smaller than the element area.

After the formation of the resist layer, portions of the multilayer film T1 (the individual layers from the upper antiferromagnetic layer 90 to the underlayer 10) not covered with the resist layer are removed by ion milling or the like. Thereby, the multilayer film T1 including the individual layers from the underlayer 10 to the upper antiferromagnetic layer 90 is left so as to have substantially a trapezoidal cross section on substantially the central region of the first electrode layer E1. Additionally, since some substances removed by ion milling are redeposited on the side faces of the multilayer film T1, the redeposited substances are preferably removed by second milling.

Subsequently, first insulating layers 101, bias underlayers 102, hard bias layers 103, and second insulating layers 104 are continuously formed by sputtering on the first electrode layer E1 so as to be abut on the side faces of the multilayer film T1. The materials for and the thicknesses of the individual layers are the same as those of the finished CPP-GMR element 1 shown in FIG. 1. Additionally, preferably, the incidence angle of sputtering is substantially perpendicular to a substrate (not shown in the drawing) or the first electrode layer E1. After the sputtering process, the resist layer is removed.

A second electrode layer E2 is then formed by sputtering on the second insulating layers 104 and the upper antiferromagnetic layer 90.

The CPP-GMR element 1 shown in FIG. 1 is thereby completed.

In this embodiment of the present invention, the element X to be incorporated into the NiFe or NiFeCo base is selected so that the sign of the spin-dependent bulk scattering coefficient β of the NiFeX alloy or NiFeCoX alloy is positive. It is also possible to select the element X so that the sign of the spin-dependent bulk scattering coefficient β of the NiFeX alloy or NiFeCoX alloy is negative if the combination of positive and negative sings of the spin-dependent bulk scattering coefficients β of the individual layers which contribute to the giant magnetoresistance effect is changed. Specifically, when each of the lower nonmagnetic layer 50 and the upper nonmagnetic layer 70 is composed of Ru or Cr, preferably, the spin-dependent bulk scattering coefficient β of the NiFeX alloy or NiFeCoX alloy is negative, and preferably, the element X having a negative spin-dependent bulk scattering coefficient β is selected.

Although the lower antiferromagnetic layer 30 and the upper antiferromagnetic layer 90 are provided in this embodiment, the antiferromagnetic layers 30 and 90 may be omitted.

Since each of the antiferromagnetic layers 30 and 90 has the largest thickness in the multilayer film T1, if they can be omitted, it is possible to greatly decrease the distance between the upper and lower shielding layers. Since the antiferromagnetic material has a large resistivity, the loss of the magnetoresistance effect due to Joule heat of the sensing current is large at the antiferromagnetic layers 30 and 90, and thus an improvement in output is impaired. Accordingly, recently, elimination of the antiferromagnetic layers 30 and 90 is considered to be preferable. When the antiferromagnetic layers are not formed, the pinned magnetic layers 40 and 80 are composed of a magnetic material having positive magnetostriction, and the magnetization directions of the pinned magnetic layers 40 and 80 are pinned by their own coercive forces.

The CPP-GMR element 1 in this embodiment is a dual spin-valve type. The present invention is also applicable to a single spin-valve CPP-GMR element. In the single spin-valve CPP-GMR element, preferably, the free magnetic layer has a two-layered structure in which a CoFe sublayer is disposed in contact with the nonmagnetic layer from a practical point of view.

In addition to use for a thin-film magnetic read head, the CPP-GMR element 1 in this embodiment can also be used for the thin-film magnetic read head on which an inductive head for writing is disposed. The CPP-GMR element 1 can also be used for various types of magnetic sensors.

According to the present invention, since each of the free magnetic layer and the second pinned magnetic sublayers is composed of a NiFeX alloy or NiFeCoX alloy, wherein X decreases the saturation magnetization of a NiFe or NiFeCo base, the saturation magnetization of each of the free magnetic layer and the second pinned magnetic sublayers is decreased compared to the case in which each of the free magnetic layer and the second pinned magnetic sublayers is composed of NiFe. Even if the thickness of each of the free magnetic layer and the second pinned magnetic sublayers is increased, an increase in the magnetic thickness can be properly suppressed. Consequently, if the thickness of each of the free magnetic layer and the second pinned magnetic sublayers is increased, it is possible to increase the change in resistance per unit area ΔR·A without degrading output sensitivity and reliability and without increasing asymmetry.

What is claimed is:

1. A CPP giant magnetoresistive element comprising a multilayer film comprising a pinned magnetic layer, a nonmagnetic layer, and a free magnetic layer disposed in that order, a current flowing in a thickness direction of the multilayer film, wherein the pinned magnetic layer comprises a first pinned magnetic sublayer and a second pinned magnetic sublayer disposed on the first pinned magnetic sublayer with a nonmagnetic intermediate sublayer therebetween, and at least the second pinned magnetic sublayer comprises a NiFeX alloy or NiFeCoX alloy, and wherein the nonmagnetic layer comprises Cu and a spin-dependent bulk scattering coefficient β of the NiFeX alloy or NiFeCoX alloy has a positive sign, the spin-dependent bulk scattering coefficient β being a value inherent in a magnetic material, the coefficient satisfying the relationship $\rho\downarrow/\rho\uparrow=(1+\beta)/(1-\beta)$, wherein $-1\leq\beta\leq 1$, $\rho\downarrow$ is a resistivity to minority conduction electrons among conduction electrons flowing through the pinned magnetic layer, and $\rho\uparrow$ is a resistivity to majority conduction electrons among the conduction electrons flowing through the pinned magnetic layer.

2. The CPP giant magnetoresistive element according to claim 1, wherein X is an element selected from the group comprising of Cu, Au, Ag, Zn, Mn, Al, Cd, Zr, or Hf.

3. The CPP giant magnetoresistive element according to claim 1, wherein the X content in the NiFeX alloy or NiFeCoX alloy is about 3 to 40 atomic percent.

4. The CPP giant magnetoresistive element according to claim 3, wherein in the NiFeX alloy or NiFeCoX alloy, the atomic ratio Ni:Fe is 9:1 to 7:3, and the Co content is greater than 0 atomic percent and equal to or less than 40 atomic percent.

5. A CPP giant magnetoresistive element comprising a multilayer film comprising a pinned magnetic layer, a nonmagnetic layer, and a free magnetic layer disposed in that order, a current flowing in a thickness direction of the multilayer film, wherein the pinned magnetic layer comprises a first pinned magnetic sublayer and a second pinned magnetic sublayer disposed on the first pinned magnetic sublayer with a nonmagnetic intermediate sublayer therebetween, and at least the second pinned magnetic sublayer comprises a NiFeX alloy or NiFeCoX alloy, and wherein the second pinned magnetic sublayer has a three-layered structure comprising an intermediate portion comprising the NiFeX alloy or NiFeCoX alloy, a first CoFe portion disposed under the intermediate portion, and a second CoFe portion disposed on the intermediate portion, the first CoFe portion and the second CoFe portion being thinner than the intermediate portion.

6. A CPP giant magnetoresistive element comprising a multilayer film comprising a lower pinned magnetic layer, a lower nonmagnetic layer, and a free magnetic layer, an upper nonmagnetic layer, and an upper pinned magnetic layer disposed in that order, a current flowing in a thickness direction of the multilayer film,
   wherein each of the lower pinned magnetic layer and the upper pinned magnetic layer comprises a NiFeX alloy or NiFeCoX alloy,
   wherein the lower pinned magnetic layer comprises a lower first pinned magnetic sublayer and a lower second pinned magnetic sublayer disposed on the lower first pinned magnetic sublayer with a lower nonmagnetic intermediate sublayer therebetween, and the upper pinned magnetic layer comprises an upper first pinned magnetic sublayer and an upper second pinned magnetic sublayer disposed on the upper nonmagnetic layer and disposed under the upper first pinned magnetic sublayer with an upper nonmagnetic intermediate sublayer therebetween, and
   wherein at least the lower second pinned magnetic sublayer and the upper second pinned magnetic sublayer comprises the NiFeX alloy or NiFeCoX alloy.

7. The CPP giant magnetoresistive element according to claim 6, wherein the X content in the NiFeX alloy or NiFeCoX alloy is about 3 to 40 atomic percent.

8. The CPP giant magnetoresistive element according to claim 7, wherein in the NiFeX alloy or NiFeCoX alloy, the atomic ratio Ni:Fe is 9:1 to 7:3, and the Co content is greater than 0 atomic percent and equal to or less than 40 atomic percent.

9. A CPP giant magnetoresistive element comprising a multilayer film comprising a lower pinned magnetic layer, a lower nonmagnetic layer, a free magnetic layer, an upper nonmagnetic layer, and an upper pinned magnetic layer disposed in that order, a current flowing in a thickness direction of the multilayer film,
   wherein each of the lower pinned magnetic layer and the upper pinned magnetic layer comprises a NiFeX alloy or NiFeCoX alloy, and wherein each of the lower nonmagnetic layer and the upper nonmagnetic layer comprises Cu and a spin-dependent bulk scattering coefficient $\beta$ of the NiFeX alloy or NiFeCoX alloy has a positive sign, the spin-dependent bulk scattering coefficient $\beta$ being a value inherent in a magnetic material, the coefficient satisfying the relationship $\rho\downarrow/\rho\uparrow=(1+\beta)/(1-\beta)$, wherein $-1\leq\beta\leq1$, $\rho\downarrow$ is a resistivity to minority conduction electrons among conduction electrons flowing through the lower pinned magnetic layer and the upper pinned magnetic layer, and $\rho\uparrow$ is a resistivity to majority conduction electrons among the conduction electrons flowing through the lower pinned magnetic layer and the upper pinned magnetic layer.

10. The CPP giant magnetoresistive element according to claim 9,
    wherein X is an element selected from the group comprising of Cu, Au, Ag, Zn, Mn, Al, Cd, Zr, or Hf.

11. A GPP giant magnetoresistive element comprising a multilayer film comprising a lower pinned magnetic layer, a lower nonmagnetic layer, and a free magnetic layer, an upper nonmagnetic layer, and an upper pinned magnetic layer disposed in that order, a current flowing in a thickness direction of the multilayer film,
    wherein each of the lower pinned magnetic layer and the upper pinned magnetic layer comprises a NiFeX alloy or NiFeCoX alloy, and wherein each of the lower second pinned magnetic sublayer and the upper second pinned magnetic sublayer had a three-layered structure comprising an intermediate portion comprising the NiFeX alloy or NiFeCoX alloy, a first CoFe portion disposed under the intermediate portion, and a second CoFe portion disposed on the intermediate portion, the first CoFe portion and the second CoFe portion being thinner than the intermediate portion.

* * * * *